United States Patent [19]

Komiak

[11] Patent Number: 4,901,032

[45] Date of Patent: Feb. 13, 1990

[54] DIGITALLY CONTROLLED VARIABLE POWER AMPLIFIER

[75] Inventor: James J. Komiak, Lansing, N.Y.

[73] Assignee: General Electric Company, Syracuse, N.Y.

[21] Appl. No.: 278,548

[22] Filed: Dec. 1, 1988

[51] Int. Cl.[4] ............................................. H03F 3/195
[52] U.S. Cl. ...................................... 330/277; 330/51; 330/279; 330/295
[58] Field of Search .................. 330/51, 277, 279, 295

[56] References Cited

U.S. PATENT DOCUMENTS

| | | | |
|---|---|---|---|
| 4,598,252 | 7/1986 | Andricos | 330/277 X |
| 4,638,190 | 1/1987 | Hwang et al. | 307/512 |
| 4,734,751 | 3/1988 | Hwang et al. | 357/22 |

*Primary Examiner*—James B. Mullins
*Attorney, Agent, or Firm*—Richard V. Lang; Fred Jacob

[57] ABSTRACT

The invention relates to a digitally controlled variable power amplifier for radio frequency signals. The power amplifier has application to power amplifiers for driving the individual elements of a phased array radar system in which accurate tapering of the power supplied to individual antenna elements is desired for sidelobe control in the face of jamming and other circumstances. In this application, each power amplifier must maintain a stable phase transfer response and should remain at a high power transfer efficiency at each reduced power setting. This performance is achieved by the use of a power transistor of a segmented dual gate design. The segments of the second gate electrode are of digitally scaled widths and are individually energized to activate digitally scaled regions of the transistor. These regions are operated in a saturated class "A" mode in all power settings to achieve the desired stable phase transfer response and high power added efficiency.

5 Claims, 4 Drawing Sheets

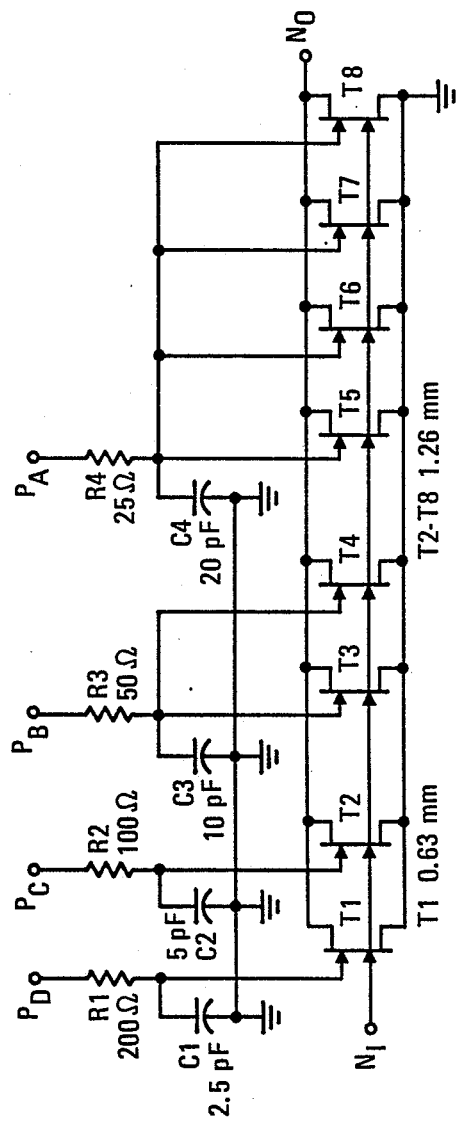
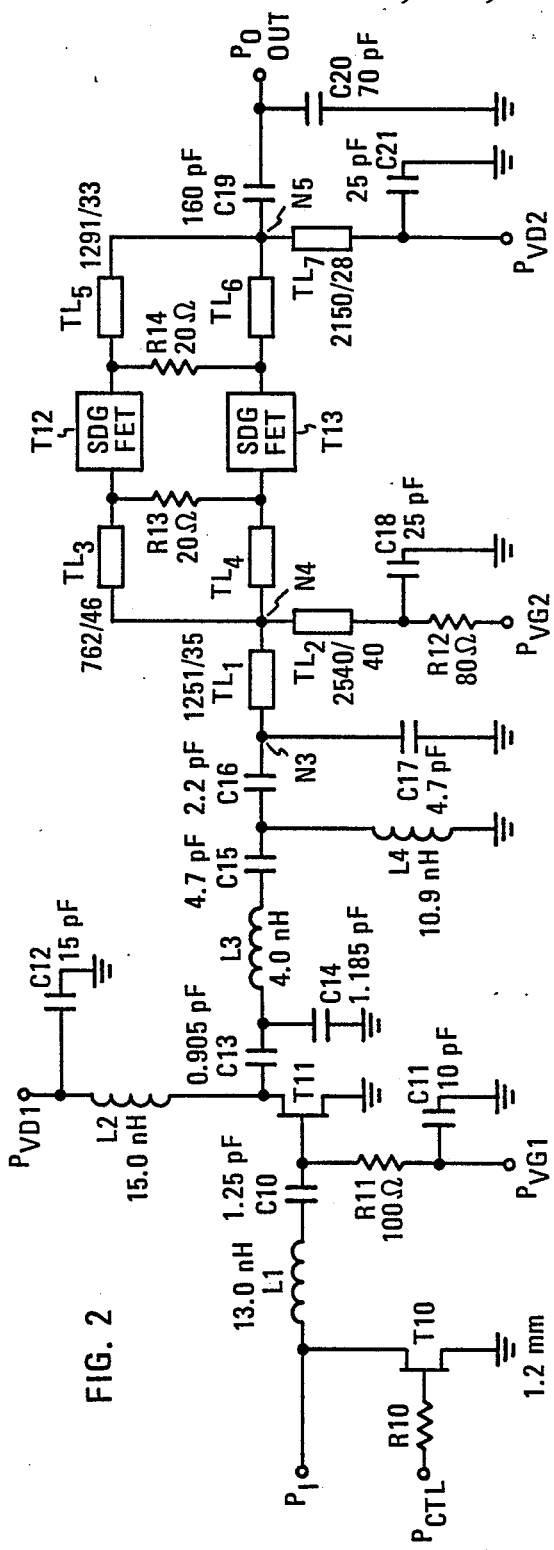
FIG. 1
FIG. 2

DIGITALLY CONTROLLED VARIABLE POWER AMPLIFIER

BACKGROUND OF THE INVENTION

1. Field of the Invention

The invention relates to digitally controlled variable power amplifiers for radio frequency signals, and more particularly to variable power amplifiers for providing accurately tapered power levels to individual antenna elements of a phased array radar system for sidelobe control.

2. Prior Art

Active array sidelobe control in transmission is an accepted means of enhancing survivability and anti-jam performance of a multi-mode agile beam radar. The conventional approach is to design the power amplifier for optimum power-added efficiency when saturated and accept the degradation in efficiency when tapering is implemented via linear operation. Unfortunately, most power amplifiers incur a significant insertion phase change from linear to saturated operation that is extremely sensitive to the gain compression level. The net result is that even the central radiating elements must be backed-off by 3 dB. This loss in addition to taper losses of 1.0 to 1.5 dB results in a significant degradation in performance.

Dual gate devices have also been explored as variable gain power amplifiers but the analog control of the second gate creates formidable linearization and calibration requirements in large arrays.

SUMMARY OF THE INVENTION

Accordingly, it is an object of the invention to provide an improved digitally controlled variable power amplifier for r.f. signals.

It is another object of the invention to provide a digitally controlled variable power amplifier for r.f. signals in which the efficiency is substantially maintained as the power level is reduced.

It is still another object of the invention to provide a digitally controlled variable power amplifier for r.f. signals having a wide dynamic range in which efficiency is substantially maintained as the power level is reduced.

It is a further object of the invention to provide a digitally controlled variable power amplifier for r.f. signals in which the transfer phase response is held substantially constant as the power level is reduced.

It is an additional object of the invention to provide an improved digitally controlled variable power amplifier for driving an element of a phased array in an agile beam radar system.

These and other objects of the invention are achieved in a novel transistor amplifier for radio frequency signals in which the power added efficiency is substantially maintained as the power level is reduced. The amplifier includes a segmented dual gate field transistor (SDGFET transistor), which provides amplification, and energization and power control means which control the power level of the SDGFET transistor.

The SDGFET transistor includes a source electrode at signal ground, a first, signal gate electrode to which input signals are applied, a drain electrode at which amplified output signals appear, and a second, conduction control gate electrode formed of a plurality of segments of scaled widths (e.g. 1, 2, 4 units) which are selectively activated.

Each gate electrode segment has a separate terminal coupled to the energization and power control means, which activates a portion of the FET coextensive with that segment, and which has an "on" setting establishing class A operation (in saturation). There is also an "off" setting by application of a pinch off potential to a segment, which inactivates the affected portion of the FET.

In the SDGFET transistor, the source, first gate, segmented second gate and drain electrodes are all of the same width determined by the desired maximum power level.

The energization and power control means thus turns on or turns off portions of the FET transistor to set a desired power level for the output signal. The application of a pinch off potential to successive segments decrements the signal power from the maximum power level and does so with a minimum reduction in power added efficiency since all active portions of the transistor continue to operate in class A (in saturation). The reduction in power level, accordingly, produces a minimum change in signal transfer phase.

In accordance with a further aspect of the invention, means are provided for facilitating efficient substitution of one parallel connected variable power amplifier for another of a higher or lower power level to effect a greater range of power control (e.g. 30 dB).

These means comprise a zero drain switched FET transistor connected at the input of the transistor amplifier, and the use of zero drain switching of the SDGFET power transistor, each providing a low impedance shunt at the input and output of the amplifier, respectively. When these low impedance shunts are placed at a quarter wavelength electrical length from common input and common output signal connections respectively, the low impedances are transformed to high impedances, thus isolating the inactive amplifier from the active circuitry, and doing so with a minimum power drain.

BRIEF DESCRIPTION OF THE DRAWINGS

The inventive and distinctive features of the invention are set forth in the claims of the present application. The invention itself, however, together with further objects and advantages thereof may best be understood by reference to the following description and accompanying drawings, in which:

FIG. 1 is a circuit diagram of a novel four-bit segmented dual gate field effect transistor (SDGFET Transistor) with power control circuitry, the configuration forming a power cell in a monolithic microwave integrated circuit (MMIC) power amplifier which maintains high power added efficiency while reducing power in 16 digital steps;

FIG. 2 is a circuit diagram of the complete MMIC amplifier utilizing the power cell of FIG. 1, and providing additional means for efficiently substituting amplifiers of scaled power levels;

FIG. 4A illustrating the constancy of the incidental phase shift as the power is reduced; FIG. 4B illustrating the constancy of power with frequency over a range of selected power reductions; and FIG. 4C illustrating the much higher normalized power added efficiency vs power output of the exemplary SDGFET transistor amplifier in comparison to a linear amplifier as the power is reduced.

DESCRIPTION OF THE PREFERRED EMBODIMENT

Figure 3:
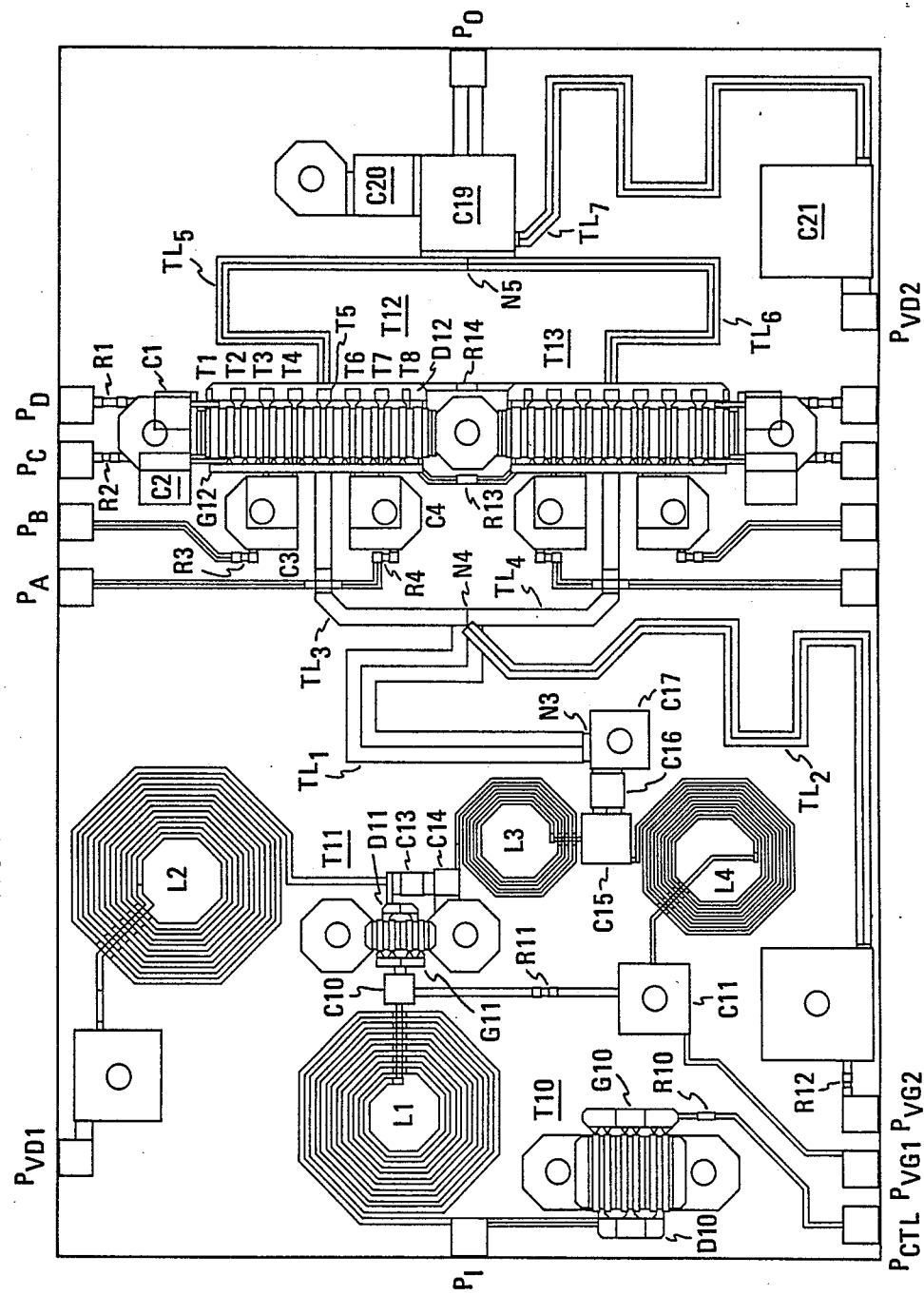
FIG. 3 is a layout of the MMIC amplifier illustrated in FIG. 2.

FIG. 1 is a circuit diagram of a four bit segmented dual gate field effect transistor (SDGFET Transistor) and power control circuit, forming a power cell in a monolithic microwave integrated circuit (MMIC) and providing an efficient digitally stepped power source.

The circuit diagram is generic to power cells which may be scaled down in power from watts to milliwatts while maintaining high power added efficiency. Should one desire to cover the full range of a thousand to one, one might require three such power cells; one for covering a lower range (e.g. from ten to one hundred milliwatts), another for covering a middle range (e.g. from one hundred milliwatts to a watt), and a third for covering an upper range (e.g. from one watt to ten watts). This selection is approximate and exemplary. The range that an individual power cell may be required to cover, will depend upon the performance criteria, and thus might involve smaller or larger numbers of power cells.

The circuit of the power cell illustrated in FIG. 1, while incorporating elements of a plurality of field effect transistors and circuit components associated with the conduction gates, is for purposes of definition neither a plurality of transistors, nor an amplifier, but rather a single segmented dual gate field effect transistor (SDGFET Transistor) with segment control circuitry.

This definition is supported by the lack of separate signal connections for each of the plural transistor segments, preventing the configuration from functioning as a plurality of separate transistors. The three signal connections are as in a single transistor; a common source electrode connected to signal ground, a common first gate electrode connected to the signal input, and a common drain electrode connected to the signal output. No signal connections are made to the number two gate electrode, which is segmented, and which activates coextensive segmented regions of the arrangement.

The circuit diagram of FIG. 1 is not an amplifier since it omits the signal conditioning, filtering and signal loads in the energization paths required of a complete amplifier.

The device is most appropriately characterized as a variable geometry FET transistor. The control circuitry illustrated in FIG. 1 connected to pads $P_A$, $P_B$, $P_C$, and $P_D$ and leading to the segmented number two gate electrode activate selected segments of the FET to adjust the power level, thus making the device functionally a variable geometry FET transistor.

In the FIG. 1 arrangement, the illustrated transistor device is a segmented dual gate FET of eight segments T1, T2, ... T8. When a set of segments (1 to 4) of the number two gate electrodes are activated, then a virtual transistor is formed having segmental dimensions corresponding to the activated segment. Each set of number two gate electrode segments activates coextensive portions of the source electrode, coextensive portions of the signal gate electrode, and coextensive portions of the drain electrode.

The segment control network comprises four rf filter networks, the latter comprising both series connected resistors R1 to R4 and by-pass capacitors C1 to C4. The relative phase shifts of the SDGFET transistors between states (referenced to the state when all segments are turned on), is minimized by selection of the capacitors $C_1$ to $C_4$, which are scaled in direct proportion to the widths of the FET segments and the resistors $R_1$ to $R_4$ which are scaled in inverse proportion to the widths of the segments. The resistors are also selected to prevent self biasing action under power conditions. The reduction is proportioned to allow the control voltage to sink/source the fractions of a milliampere of gate current required to maintain gate control.

The segment control network links the second gate electrodes of eight segments to four separate conduction control terminals ($P_A$, $P_B$, $P_C$, and $P_D$) providing a selection of $2^4$ (i.e. 16) segment configurations corresponding to $2^4$ power states.

The electrical connections to the 16 state power cell are illustrated in FIG. 1. The eight segments are individually legended T1, T2, ...T8. The source electrode of each segment is a portion of a continuous electrode and is connected to ground. The first or signal gate electrode of each segment is also a portion of a continuous electrode, and is connected to the node $N_I$ (I for input). The second or control gate is segmented, as will be explained below, and connected to the segment control network. The drain electrode of each segment is a portion of a continuous electrode and is connected to the node $N_O$ (O for output).

The segmented second gates of the FET segments are connected as follows to the segment control network. The second gate of the segment $T_1$ is connected to the junction of $R_1$ and $C_1$ and via $R_1$ to the segment control pad $P_D$. The second gate of the segment $T_2$ is connected to the junction of $R_2$ and $C_2$, and via $R_2$ to the segment control pad $P_C$. The second gates of the third and fourth segments $T_3$ and $T_4$ are connected to the junction of $R_3$ and $C_3$, and via $R_3$ to the segment control pad $P_B$. Finally, the second gates of the segment $T_5$, $T_6$, $T_7$ and $T_8$ are connected to the junction of $R_4$ and $C_4$, and via $R_4$ to the segment control pad $P_A$.

The FIG. 1 power cell is adjusted for efficient operation at the maximum power level, and for a minimum reduction in power efficiency as the power level is decreased. The FET segments are of a common gate length and of effectively binary scaled gate widths. In particular, the effective gate widths and circuit values of the segment control circuits for a 10 GHz application are illustrated in FIG. 1.

The SDGFET transistor is MMIC fabricated, formed as part of the larger amplifier circuit illustrated in FIG. 2, using the layout shown in FIG. 3. The substrate is fabricated upon a 5 mil gallium arsenide substrate. The selection of gallium arsenide as the substrate material is in accordance with current practice for field effect transistors designed to work in the range of from one to 100 Gigahertz.

The electrodes of the eight segments, except for the number two gate electrodes, may be sections of a continuous electrode structure, with segmentation of the number two gate electrode permitting coextensive regions of the source electrode and drain electrode to become active while adjacent regions remain inactive as earlier explained. Thus segmentation of the number two gate electrodes defines segmental regions of the FETs without the need to partition the source, signal gate, or drain electrodes.

As suggested in FIG. 1, the segments of control gates may be either formed of unequal length segments scaled in a binary fashion or formed of equal length segments with the segments being conductively connected in sets of 1, 2, or 4 to achieve binary scaling.

Binary scaling results in 3 dB power steps between MSB states (i.e., those states that represent one segment on with all others off). By adjusting the segment length to other than binary ratio's, an arbitrary step size may be realized.

The binary scaling of segments results in a linear power scale, i.e., for a 4-bit device, the relative power is adjustable from 16/16 to 1/16 in 1/16 steps. This adjustment range is thus denser at maximum power, and coarser with steeper steps at lower powers. This type of scale is desirable from a phased array viewpoint since sum pattern weights, such as Taylor weights, exhibit fine, small steps near the center with a gentle roll-off that becomes increasingly more rapid as the edge is approached. A linear scale as is implemented in the described embodiment will thus result in lower sidelobes than a dB scale due to better quantization fidelity of the desired pattern weights.

In the FIG. 1 illustration, the smallest segment ($T_1$) is one-half the width of the other segments ($T_2 - T_8$), which while being equal in width are connected together in sets of 1, 2, or 4. With large gate width devices, good rf signal manifolding may dictate a parallel row structure, in which the length of a row or half or one-quarter of a row corresponds to the lowest digital value, and two or four rows are manifolded to form the widest segments.

The power state of the SDGFET transistor of FIG. 1 is controlled by the applied DC voltages. The source electrode (common to all segments) is connected to substrate ground and the voltages applied to the other electrodes are referenced to substrate ground. The drain voltage ($V_{DS}$) coupled to the common drain electrode is typically 10 volts for the maximum power setting. Maximum power operation results when the number one or signal grid (common to all segments) is at a maximum power setting ($V_{GS}$), typically at minus one volt. The rf signal is set for saturated class "A" operation, (i.e. with conduction occurring throughout the rf cycle). For maximum power of the SDGFET transistors, typically zero control voltages are applied via the pads $P_A$, $P_B$, $P_C$, $P_D$, to the number two gate electrodes.

The power, in accordance with the invention, may be digitally reduced while maintaining efficiency, by switching off individual segments by application of a pinch-off voltage ($V_P$) to the number two gate electrodes. The pinch-off voltage is typically minus 3.5 volts. Zero power occurs when all the number two gate electrodes are at pinch-off voltage.

A third state of the SDGFET transistor is a high conduction low-power state using zero bias drain switching. This state is used when the amplifier is inactive and it is desired to isolate the inactive amplifier from parallelled active amplifiers. A depletion mode SDGFET transistor, with the drain voltage removed and a zero gate or near zero gate potential applied to the number two gate electrode, reverts to a low impedance state in which the resistance between source and drain is very low, typically from 0.2 to one ohm. This feature is useful when quarter wave isolation paths are provided to convert the low impedance short circuit in the signal path to a high impedance open circuit at operating frequencies at the circuit branches. With inactive amplifiers appearing to be open circuits, parallel connection of active and inactive amplifiers is permitted without the loss of efficiency caused by loading due to the inactive amplifier.

In normal operation, the SDGFET transistor is operated with an ac signal on the number one gate electrode having a maximum value set by allowable distortion and one that is insufficient to cut-off the segment on negative signal swings when biased for maximum efficient power. Successively lower power states are then achieved by applying a pinch-off potential via the pads $P_A$, $P_B$, $P_C$, and $P_D$ to the number two gate electrodes to achieve lower power states with sustained power added efficiency.

Successive milder reductions in gain accompany successive power reductions in the SDGFET transistor and must be compensated for if the SDGFET transistor is to remain saturated. The SDGFET transistor is preferably operated in saturation for efficiency, as noted earlier. In addition saturated operation has the advantage of leveling the output signal against variations in the input signal. To achieve this objective, sufficient signal drive is required of a driver stage to insure that there is adequate gain to drive the SDGFET into saturation in the lowest power states. In a practical example adequate gain for the lowest power state results in several (e.g. 6 or 7) db of overdrive in the highest power state. Moderate overdrive, due to the signal equalizing effect of saturated operation, does not adversely affect the accuracy of the desired power levels and ordinarily harmonic distortion is of minor concern and readily removed if desired.

The amplifier circuit for an intermediate power range of from 100 milliwatts to a watt is illustrated in FIG. 2, with the layout of a MMIC embodiment being illustrated in FIG. 3. The amplifier provides an input switch for amplifier isolation when paralleled and a driver stage for the power amplifier insuring saturated operation. The power amplifier employs two SDGFET transistors. The amplifier is accordingly designed to being paralleled with two other like amplifiers having a respectively lower and higher power range without loss in power added efficiency.

Referring now to FIGS. 2 and 3, the signal input pad $P_I$ is connected to a shunt connected transistor switch $T_{10}$. The drain electrode of the transistor switch is connected to the pad $P_I$ and the source electrode is connected to ground, with the gate electrode being connected via a 50 ohm resistor $R_{10}$ to the pad $P_{CTL}$. Control potentials are applied to the control potential pad $P_{CTL}$ to operate the switch. When the switch is non-conductive by application of a negative bias to the gate, the shunt path is of near infinite resistance and signals may enter the amplifier. When the switch is conductive by application of a zero or small positive bias, a low impedance short circuit occurs across the input, and signals are blocked from entering the amplifier.

Input signals coupled to the input pad $P_I$, assuming that the switch $T_{10}$ is open, are fed through a tuned coupling network consisting of a serially connected inductor $L_1$ and a 1.25 pf capacitor $C_{10}$ to the gate electrode of driver transistor $T_{11}$. The source of the transistor $T_{11}$ is grounded, and the gate electrode is connected via an rf filter consisting of a series 100 ohm resistor and a shunt 10 pf by-pass capacitor $C_{11}$ to the pad $P_{VG1}$. The drain electrode of the preamplifier transistor is connected via a further rf filter (and load) inductor $L_2$ to the pad $P_{VD}$, by-passed to ground by a 15 pf capacitor $C_{12}$. The gain of the driver may be adjusted by the voltage applied to the pad $P_{VG2}$.

Amplified signals appearing at the drain of $T_{11}$ are then coupled through an interstage coupling network to the node $N_3$ at the input to an impedance matching microstrip transmission line ($TL_1-TL_4$) leading to the inputs of two paralleled SDGFET amplifiers. The interstage coupling network comprises series capacitor $C_{13}$, shunt capacitor $C_{14}$, series inductor $L_3$, series 4.7 pf capacitor $C_{15}$, shunt inductor $L_4$, series 2.2 pf capacitor $C_{16}$, and shunt 4.7 pf capacitor $C_{17}$.

The impedance matching network consists of a first transmission line $TL_1$ connected between node $N_3$ and node $N_4$. The second transmission line $TL_2$ connects node $N_4$ via an rf filter consisting of a shunt capacitor $C_{18}$ and a series resistor $R_{12}$ to the pad $P_{VG2}$. The transmission line $TL_3$ connects the node $N_4$ to the number one gate electrode of the upper SDGFET transistor $T_{12}$. The transmission line $TL_4$ connects the node $N_4$ to the number one gate electrode of the lower SDGFET transistor $T_{13}$, thus closing the signal path from the output of the driver amplifier transmitter $T_{11}$ to the inputs of the two SDGFET transistors of the amplifier.

The segmented transistors depicted in the blocks $T_{12}$ and $T_{13}$ of FIG. 2, and the control network have the circuit diagram illustrated in FIG. 1. The layout of the transistors (and the amplifier) are illustrated in FIG. 3. Since the two transistors $T_{12}$ and $T_{13}$ are identical, the description directed primarily to transistor $T_{12}$ also applies to transistor $T_{13}$. The transistor segments indicated in FIG. 1 are enumerated as "rows" connected to the number one signal gate manifold $G_{12}$ to the left of the transistor and connected to transmission line $TL_3$ with the upper most row corresponding to the first segment $T_1$, successively lower rows corresponding to $T_2$, $T_3$, etc. to $T_8$. The number two control gate of transistor segment $T_1$ is connected via the filter $R_1$, $C_1$ to the upper pad $P_D$. The number two control gate of transistor segment $T_2$ is connected via the filter $R_2$, $C_2$ to the upper pad $P_C$. Similarly the number two gates of transistor segments $T_3$ and $T_4$ are connected via the filter $R_3$, $C_3$ to the upper pad $P_B$. Finally the number two gates of transistor segments $T_5-T_8$ are connected via the filter $R_4$, $C_4$ to the upper pad $P_A$.

The outputs from the drain manifolds of $T_{12}$ and $T_{13}$ are connected by two balanced transmission lines $TL_5$ and $TL_6$ to the node $N_5$. The drain node $T_5$ is returned via the transmission line $TL_7$, by-passed by capacitor $C_{21}$ to the pad $P_{VD}$ for application of drain potentials. The drain node $N_5$ is coupled by a capacitive impedance transformer $C_{19}$, $C_{20}$ to the output pad $P_O$.

The input transmission lines $TL_3$ and $TL_4$ and output transmission lines $TL_5$ and $TL_6$ are designed to provide balanced input signal distribution to the signal gates and balanced output signal derivation from the two transistors $T_{12}$ and $T_{13}$. The resistor $R_{13}$ interconnects the number one signal gate manifolds of transistors $T_{12}$ and $T_{13}$, and the resistor $R_{14}$ interconnects the drain manifolds of transistors $T_{12}$ and $T_{13}$.

The signal power output from transistors and dc power supplied to the output SDGFETs $T_{12}$ and $T_{13}$ is coupled to node $N_5$. The output signal is coupled from node $N_5$ via a capacitive voltage divider $C_{19}$ and $C_{20}$ to the signal output pat $P_O$. DC power is supplied to the node $N_5$ from the pad $P_{VD2}$, through an rf filter comprising the by-pass capacitor $C_{21}$ and the transmission line element $TL_7$.

Figure 4A:
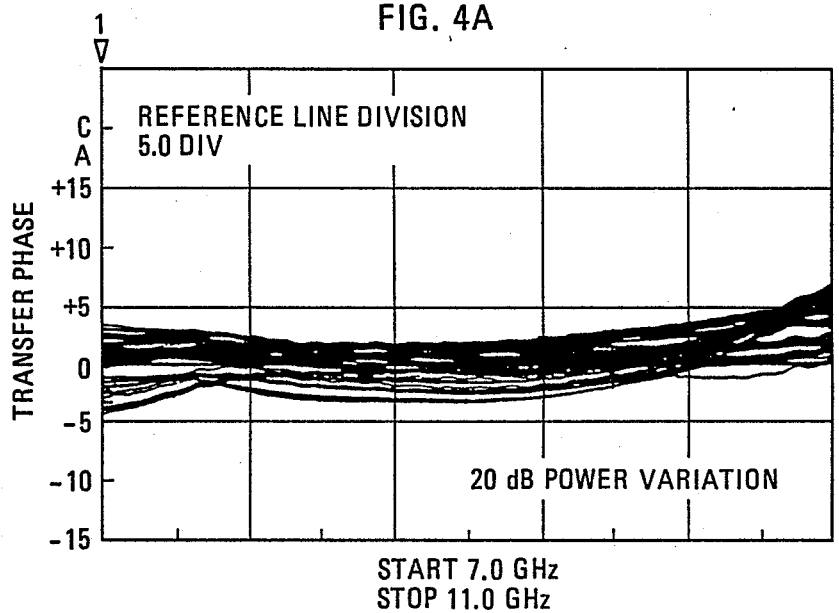
FIGS. 4A, 4B and 4C are three curves illustrating the performance of a two stage 3 bit SDGFET amplifier.
Figure 4B:
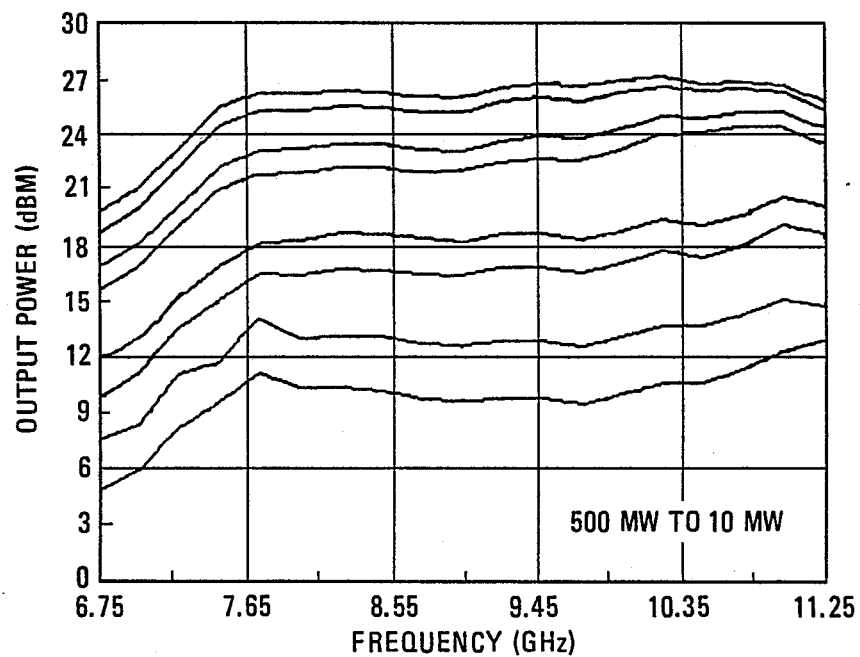
Figure 4C:
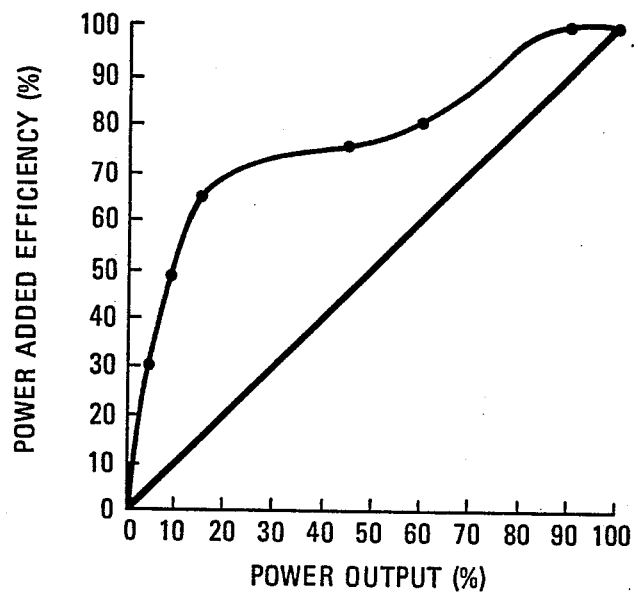

An arrangement similar to that illustrated in FIG. 1 but having $2^6$ or 64 states, achieved by cascading two stages each having 8 states provides the performance illustrated in FIGS. 4A, 4B and 4C. The arrangement maintains a phase transfer performance to within plus or minus 5° over a band of 7 to 11 Gigahertz, and over a dynamic range of 20 dB (100-1 in voltage).

The power output of the 64 state arrangement over approximately the same frequency range (6.75 to 11.25 Gigahertz) is illustrated in FIG. 4B. The individual plots illustrate a substantially flat (plus or minus 2 dB) power level from 7.65 to 11.25 Gigahertz over a 15 dB dynamic range (i.e. 500 mw to 10 mw). FIG. 4C illustrates the normalized power added efficiency versus power output of the same 6 bit arrangement. The curve illustrates that at a power reduction to about 15%, the normalized power added efficiency of the arrangement remains above 65%, before it drops precipitously due to a reduction in gain. In comparison, the power added efficiency of a conventional linear amplifier falls linearly so that at a power reduction to 15%, the normalized power added efficiency is reduced to 15%, or four times worse.

In contrast to the previous embodiment, the cascade of two SDGFET states results in a wider power adjustment range equal to the sum of the individual stage range on a dB scale, but at the expense of operation in the low efficiency region (below 20%) shown on FIG. 4C. The linear preamplification stage in the former allows specification of gain level independent of power adjustment range. As described subsequently, an embodiment with constant input power utilizing paralleled SDGFET power amplifier stages requires preamplification in the higher power stages.

The invention permits one to retain a normalized efficiency in excess of 65%, if one is content not to reduce the power further than to 15% of the maximum in the exemplary design. Granted that a greater range of efficient power reduction is required, and that one must satisfy power added efficiency, transmit gain and a maximum transmit drain level, and at the same time minimize GaAs chip size, one may parallel several amplifiers in the manner illustrated in FIG. 5.

Figure 5:
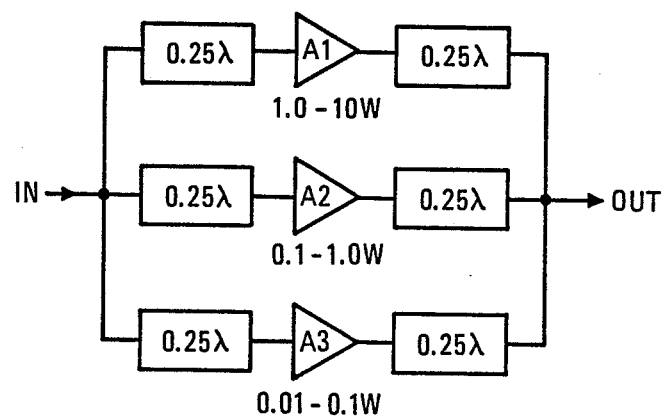
FIG. 5 is a simplified block diagram of a power amplifier combination in which three SDGFET power amplifiers of successively lower powers are connected in parallel for successive substitution, and in which high power added efficiency is maintained as the power level is reduced.

In the FIG. 5 arrangement three amplifiers, each having overlapping power levels approximately ten times greater than the succeeding one, and each having an approximately 10 to 1 range of power levels (or 4 bits) may be efficiently paralleled to achieve a 30 dB range of efficient power levels. While one could use a single amplifier with additional bits of power resolution, a constrained conservative design dictates that one use 4 bits of each of three 5 bit SDGFET transistors, in three paralleled amplifiers to achieve the desired power control range. The fifth bit is for calibration purposes, i.e., to maintain uniform power step size, particularly at crossovers between parallel paths.

The three-way branching, granted that it is done efficiently, avoids the loss in signal gain as the number of active segments are being reduced in a SDGFET transistor. In the lowest power state of a SDGFET transistor, all portions of the number one signal gates are driven, which sustains the input loading and phase response but reduces the signal gain. Assuming a 16 to 1 power reduction, only 6.25% of the signal drive is used to drive the active segment in the lowest power setting and 93.75% of the signal is unused. The resultant gain reduction can be mitigated by cascading two segmented stages so as to provide increased drive at higher power levels, and reducing the scaling ratios in both the driver and power stages. In one example, three bits of gain reduction are provided in each stage to achieve 64 bits of power adjustment. The strategy significantly improves the power added efficiency at lower power levels over that of a non-segmented design.

A strategy which is more efficient of signal energy is that provided by paralleling segmented but isolatable power amplifiers of scaled power levels as for instance in three parallel branches. Branching allows each amplifier to be segmented for a more limited range of power reduction, but the circuit for isolating the inactive amplifiers must insure that, while connected in parallel, the inactive amplifier does not absorb signal energy.

The arrangement of FIG. 5 is a simplified block diagram of an efficient arrangement having three branches. In the interest of isolation, each power amplifier has a low impedance switch at the amplifier input spaced a quarter wavelength from an input node common to the three amplifiers. In addition, each power amplifier has an amplifier output stage, (when it has a low impedance zero drain bias off state), or an independent switch at the amplifier output spaced a quarter wavelength from the common output node.

Granted that each inactive amplifier exhibits an input and an output short circuit impedance at the center of the operating band, and that each short circuit is spaced by a quarter wave path to the respective common input and output nodes, each will appear to be an open circuit at the nearest node. Thus under these conditions no input signal energy will be diverted to the inactive amplifier from the source of input signals nor will output signal energy be diverted from the active amplifier to the inactive amplifier.

Efficient paralleling is provided in the FIG. 1 amplifier. In that amplifier, the transistor $T_{10}$ is an input switch, which may become a low impedance short circuit by applying a zero or small positive voltage via the pad $P_{CTL}$ to the gate electrode. A grounded source without the need for a drain potential is all that is required. The switch $T_{10}$ may be turned off by applying the negative pinch-off potential to the gate electrode. In the conductive state, the switch $T_{10}$ neither absorbs energy from the power supply nor significant energy from the signal.

The output stages of the inactive power amplifiers are non-dissipative of the signal at the output node $N_5$. In the two higher power amplifiers, each output stage is adjusted for a low impedance state by using zero bias drain switching which is of a sufficiently low value as to achieve the desired reflection. In the lowest power output stage, where the low impedance state is not low enough, a shunt switch is provided at the amplifier output and a suitable bias is applied to the gate electrode of the switch (with zero drain voltage) to achieve the desired low impedance state.

In the illustrated input and output connections, the gate switched FET shunt switches and the zero bias drain switched SDGFET transistors operate efficiently. When the devices are in the low impedance state (when the amplifiers are inactive), neither absorbs energy from the drain bias supply nor significant signal energy. This permits one to parallel amplifiers containing SDGFET transistors without loss in power efficiency as the power level is reduced, should conservative design for yield enhancement, gain considerations, or chip size, (etc.) dictate a paralleled design.

The selection of SDGFET power amplifier topology is based upon maintaining efficiency. If the SDGFET device is increased in width by adding additional fingers, at some point, efficiency will degrade due to phase lag upon gate and drain manifolds preventing coherent summation of the power contribution of each segment. Similarly, if finger length is increased too far, gate and drain attenuation of the power contribution will degrade efficiency. At this point, the multiple SDGFET cell approach as depicted in FIGS. 2 and 3 is the selection of choice, when further power adjustment range than is efficiently attainable in a single amplifier is required, the parallel approach is the selection. For the example of FIG. 5, each parallel amplifier stage results in a range extension of 10 dB. The granularity (i.e, resolution or number of bits) is determined by the number of bits in each SDGFET amplifier, while the range is determined by the number of parallel amplifier stages. For the example given with 4-bit resolution per amplifier, the composite result is 5½-bit resolution over a 30 dB range. If a fourth path is added, 6-bit resolution over a 40 dB range is realizable, i.e., each binary increment in parallel paths results in an increase of resolution by one bit.

With the variables of segment ratio, number of bits, and number of parallel amplifier stages, an efficient arbitrary power range and resolution is realizable with minimal incidental phase shift under digital control.

The invention has primary application to radio frequency amplifiers in radar transmitters in phased array radar systems. The frequencies of interest are now often in excess of 1 GHZ, and approaching 100 GHZ. In such applications, the SDGFET power transistors are normally formed using high frequency semiconductor materials such as GaAs. When GaAs materials are employed, and the frequencies are sufficiently high to permit compact electronic circuit layouts, the SDGFET transistors and associated circuits making up the complete amplifier may be fabricated on a single substrate using monolithic microwave integrated circuit (MMIC) techniques. The invention may, of course, be applied to r.f. power systems, other than phased array radar systems, and may be carried out using discrete transistors in hybrid arrangements, and using other lower frequency semiconductor materials.

What is claimed is:
1. In a transistor amplifier for radio frequency signals in which power added efficiency is substantially maintained as the power level is reduced, the combination comprising:
    A. a segmented dual gate field effect transistor (SDGFET) for r.f. signal amplification comprising:
       (i) a source electrode at signal ground,
       (ii) a first, signal gate electrode, adjacent to the source electrode to which input signals are applied, referenced to signal ground,
       (iii) a drain electrode, at which amplified output signals appear, referenced to signal ground,
       (iv) a second, conduction control gate electrode, adjacent to the drain electrode, formed of an m-fold plurality of segments of scaled widths (e.g. 1, 2, 4, units) selected to achieve a greater than m fold plurality of effective segmental widths (e.g. 1, 2, 3, 4, 5, 6, 7 units) when selectively activated,

(v) each segment having a separate terminal for activating a portion of the FET coextensive with said segment when a first potential is applied, and for inactivating said portion when a second potential is applied, said source, first gate, segmented second gate, and drain electrodes being of a width determined by the desired power level and coextensive;

each SDGFET portion having a first saturated class A state at a desired power level, and a second zero current zero power state, as a function of the potentials applied to said electrodes;

B. a FET driver stage to which an input r.f. signal is applied, and from which an amplified r.f. signal is obtained and coupled to the first gate electrode of said SDGFET, said FET driver stage supplying said r.f. signal at an amplitude which substantially saturates said SDGFET transistor in a minimum power level, at which the SDGFET transistor gain is minimum, thus insuring saturated operation and thereby accurately scaled power levels and a uniform phase transfer response at all power levels of said SDGFET transistor; and C. energization and power control means for said SDGFET comprising:
(i) means to apply a dc bias between source and drain electrodes for efficient signal amplification,
(ii) means to bias said first gate electrode for signal amplification at a saturated power setting, and
(iii) means for selectively applying one of said two potentials to each of said m fold segment terminals to set a desired power level for the output signal appearing at said drain electrode, the application of said second potential to successive segment decrementing the signal power from the maximum power level with a minimum reduction in power added efficiency and a minimum change in signal transfer phase.

2. The combination set forth in claim 1 wherein said segments are in binary scaled widths (i.e., 1, 2, 4, etc.) to achieve effective digital segmental widths (i.e., 1, 2, 3, 4, 5, 6, 7 etc.), said power reduction occurring in steps of equal fractions, whereby the initial power reductions are proportionally fine and become successively more coarse.

3. The combination set forth in claim 2 wherein m fold r.f. filters are provided, one in each path between a segment terminal and said energization and power control means, each r.f. filter comprising a capacitor shunting a segment to signal ground and a serial resistor, the values of said respective capacitors increasing in proportion to segment widths and the values of said respective resistors decreasing in proportion to segment widths to equalize the signal transfer phase response at differing power levels.

4. In a transistor amplifier for radio frequency signals in which power added efficiency is substantially maintained as the power level is reduced, the combination comprising:
A. a segmented dual gate field effect transistor (SDGFET) for r.f. signal amplification comprising:
(i) a source electrode at signal ground,
(ii) a first, signal gate electrode, adjacent to the source electrode to which input signals are applied, referenced to signal ground,
(iii) a drain electrode, at which amplified output signals appear, referenced to signal ground,
(iv) a second, conduction control gate electrode, adjacent to the drain electrode, formed of an m-fold plurality of segments of scaled widths (e.g. 1, 2, 4, units) selected to achieve a greater than m fold plurality of effective segmental widths (e.g. 1, 2, 3, 4, 5, 6, 7 units) when selectively activated,
(v) each segment having a separate terminal for activating a portion of the FET coextensive with said segment when a first potential is applied, and for inactivating said portion when a second potential is applied, said source, first gate, segmented second gate, and drain electrodes being of a width determined by the desired power level and coextensive;

each SDGFET portion having a first saturated class A state at a desired power level, a second zero current zero power state, and a third high conduction low-power state, as a function of the potentials applied to said electrodes;

B. signal input terminals;
C. a FET driver stage coupled to said signal input terminals from which an amplified r.f. signal is obtained and coupled to the first gate electrode of said SDGFET, said FET driver stage supplying said r.f. signal at an amplitude which substantially saturates said SDGFET transistor in a minimum power level, at which the SDGFET transistor gain is minimum, thus insuring saturated operation and thereby accurately scaled power levels and a uniform phase transfer response at all power levels of said SDGFET transistor;
D. signal output terminals coupled to an of said SDGFET;
E. means for facilitating activation/inactivation of said amplifier, when connected in parallel with other like amplifiers, comprising:
a FET shunt switch, having the source electrode connected to signal ground, the drain electrode connected to one of said signal input terminals to provide zero dc source to drain potential, and a gate electrode; said FET shunt switch having a zero current zero power state, and a high conduction low power state as a function of the potentials applied to said electrodes;
F. energization and power control means for said SDGFET and said FET shunt switch comprising:
(i) means for selectively applying a dc bias between source and drain electrodes of said SDGFET for efficient signal amplification, the application of said dc bias to said drain activating said transistor amplifier and removal of said dc bias facilitating inactivation,
(ii) means to bias said first gate electrode of said SDGFET for signal amplification at a saturated power setting, and
(iii) means for selectively applying one of said two potentials to each of said m fold segment terminals to set a desired power level for the output signal appearing at said SDGFET drain electrode, the application of said second potential to successive segments decrementing the signal power from the maximum power level with a minimum change in signal transfer phase; and
(iv) means coupled to the gate electrode of said shunt switch to selectively apply a conduction inhibiting potential to said gate electrode to activate said transistor amplifier, and to remove said inhibiting potential and allow zero drain conduction to inactivate said transistor amplifier;

the removal of said dc bias from the drain electrode of said SDGFET and the application of said first potential to each of said segments causing said SDGFET to assume said third state, creating a low impedance shunt at the amplifier signal output terminals for inactivating said transistor amplifier.

5. Variable power amplification means for radio frequency signals in which power added efficiency is substantially maintained as the power level is reduced comprising:

A. an input terminal to which an r.f. signal is supplied;

B. at least two amplifiers of differing power levels, each amplifier having
 (1) a first transmission line of a quarter wave electrical length at the operating frequency having one end connected to said r.f. input terminal;
 (2) a FET shunt switch, having the source electrode connected to signal ground, the drain electrode to the other end of said transmission line to provide zero dc source to drain potential, and the gate electrode connected to a control terminal;
 (3) a SDGFET for r.f. signal amplification, comprising:
  (i) a first, signal gate electrode, connected to said other end of said transmission line,
  (ii) a source electrode at signal ground,
  (iii) a drain electrode, at which output r.f. signals appear,
  (iv) a second, segmented, conduction control gate electrode, adjacent to the drain electrode,
  (v) a separate terminal associated with each segment for applying a first activating or a second inactivating potential to the segment to activate or inactivate an associated portion of the SDGFET coextensive with said segment;

each SDGFET portion having a first saturated class A state at a desired power level, a second zero current zero power state, and a third high conduction low-power state, said shunt switch having a zero current zero power state, and a high conduction low power state as a function of the potentials applied to said electrodes;
 (4) a second transmission line of a quarter wave electrical length at the operating frequency having one end connected to the drain electrode of said SDGFET;

C. an output terminal coupled to the other end of said second transmission line for deriving from said two amplifers r.f. signals at predetermined power levels; and D. energization and power control means comprising:
 (i) means coupled to said control terminals for biasing the FET shunt switch of one of said amplifiers off, to facilitate activation of said one amplifier, and the other FET shunt switch on to facilitate inactivation of said other amplifier,
 (ii) means to apply an operating bias between source and drain electrodes of the SDGFET transistor in said one active amplifier, and to remove the operating bias between source and drain electrodes of the other SDGFET transistor for facilitating said third state operation in the SDGFET of the inactive amplifier, and
 (iii) means for selectively applying one of said two potentials to each of the segment terminals of the operating SDGFET transistor in said one active amplifier, to set a desired power level for the output signal appearing at said drain electrode, the application of said second potential to successive segments decrementing the signal power from the maximum power level with a minimum reduction in power added efficiency and a minimum change in signal transfer phase, the segments in the SDGFET in said inactive amplifier having said first potential applied thereto for operation in said third state.

* * * * *